United States Patent
Park et al.

(10) Patent No.: US 10,917,965 B2
(45) Date of Patent: Feb. 9, 2021

(54) DISPLAY PANEL AND DISPLAY DEVICE INCLUDING THE SAME

(71) Applicant: SAMSUNG DISPLAY CO., LTD., Yongin-si (KR)

(72) Inventors: Hyunae Park, Yongin-si (KR); Wonkyu Kwak, Yongin-si (KR); Dongsoo Kim, Yongin-si (KR); Jieun Lee, Yongin-si (KR); Soyoung Lee, Yongin-si (KR); Wonmi Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/583,680

(22) Filed: Sep. 26, 2019

(65) Prior Publication Data

US 2020/0029432 A1   Jan. 23, 2020

Related U.S. Application Data

(63) Continuation of application No. 15/827,212, filed on Nov. 30, 2017, now Pat. No. 10,470,306.

(30) Foreign Application Priority Data

Mar. 17, 2017   (KR) .................. 10-2017-0033872

(51) Int. Cl.
*H05K 1/11* (2006.01)
*H01L 21/00* (2006.01)
(Continued)

(52) U.S. Cl.
CPC ......... *H05K 1/113* (2013.01); *G02F 1/13458* (2013.01); *H01L 27/3248* (2013.01);
(Continued)

(58) Field of Classification Search
CPC ........... H05K 1/11; H01L 21/00; H01L 23/48; H01L 27/12; H01L 27/32; G02F 1/136; G02F 1/1333; G02F 1/1343
(Continued)

(56) References Cited

U.S. PATENT DOCUMENTS 4,434,434 A * 2/1984 Bhattacharya .... H01L 23/53209
257/737
5,268,072 A * 12/1993 Agarwala ............... H01L 24/03
216/13
(Continued)

FOREIGN PATENT DOCUMENTS

KR   1020060078549 A   7/2006
KR   1020070070547 A   7/2007
(Continued)

OTHER PUBLICATIONS

Extended European Search Report for Application No. 17197194.8-1210 dated Apr. 24, 2018.

*Primary Examiner* — Xiaoliang Chen
(74) *Attorney, Agent, or Firm* — Cantor Colburn LLP

(57) ABSTRACT

A display panel includes: a substrate including a display area and a peripheral area outside the display area; and a first conductive layer in the peripheral area, an entire upper surface of which is exposed to an outside of the display device. The first conductive layer includes a main part and a plurality of protrusions protruding from the main part in a direction parallel to an upper surface of the substrate.

16 Claims, 12 Drawing Sheets

(51) Int. Cl.
*H01L 23/48* (2006.01)
*H01L 27/12* (2006.01)
*H01L 27/32* (2006.01)
*G02F 1/136* (2006.01)
*G02F 1/1333* (2006.01)
*H01L 51/00* (2006.01)
*H01L 51/52* (2006.01)
*G02F 1/1345* (2006.01)
*H05K 1/02* (2006.01)

(52) U.S. Cl.
CPC ...... *H01L 27/3276* (2013.01); *H01L 51/0097* (2013.01); *H01L 51/5256* (2013.01); *H05K 1/028* (2013.01); *G02F 2201/122* (2013.01); *G02F 2201/123* (2013.01); *H01L 2251/53* (2013.01)

(58) Field of Classification Search
USPC ........ 174/260; 349/38, 43, 44, 66, 138, 139, 349/141, 149; 257/40, 59, 72, 734, 737; 438/30, 158, 608
See application file for complete search history.

(56) References Cited

U.S. PATENT DOCUMENTS

| | | | |
|---|---|---|---|
| 5,801,452 A | 9/1998 | Farnworth et al. | |
| 6,297,559 B1 | 10/2001 | Call et al. | |
| 6,653,216 B1* | 11/2003 | Shimomaki | H01L 27/12 257/E27.111 |
| 8,053,293 B2* | 11/2011 | Kim | G02F 1/1309 257/E21.521 |
| 8,334,539 B2 | 12/2012 | Kim et al. | |
| 8,698,189 B2 | 4/2014 | Park et al. | |
| 2001/0000905 A1* | 5/2001 | Davis | B23K 3/0623 228/180.22 |
| 2002/0033531 A1* | 3/2002 | Matsushima | H01L 24/11 257/734 |
| 2003/0164919 A1* | 9/2003 | Oh | G02F 1/13452 349/149 |
| 2004/0109102 A1* | 6/2004 | Chang | G02F 1/134336 349/44 |
| 2004/0175862 A1 | 9/2004 | Tao et al. | |
| 2004/0218288 A1 | 11/2004 | Pierson et al. | |
| 2005/0046776 A1 | 3/2005 | Ahn et al. | |
| 2005/0072984 A1 | 4/2005 | Kwak et al. | |
| 2005/0270451 A1 | 12/2005 | Ahn | |
| 2005/0270454 A1 | 12/2005 | Ahn et al. | |
| 2005/0287829 A1* | 12/2005 | Ichikawa | H05K 3/3436 439/66 |
| 2006/0081845 A1* | 4/2006 | Bae | H01L 27/329 257/59 |
| 2006/0139502 A1* | 6/2006 | Ahn | G02F 1/136286 349/38 |
| 2006/0139547 A1 | 6/2006 | Ahn et al. | |
| 2006/0139552 A1 | 6/2006 | Ahn | |
| 2006/0146214 A1* | 7/2006 | Hwang | G02F 1/13452 349/43 |
| 2006/0146256 A1* | 7/2006 | Ahn | G02F 1/134309 349/141 |
| 2006/0261950 A1 | 11/2006 | Arneson et al. | |
| 2007/0075122 A1 | 4/2007 | Singleton et al. | |
| 2007/0196941 A1* | 8/2007 | Shyu | G02F 1/136227 438/30 |
| 2008/0023830 A1* | 1/2008 | Chang | H01L 24/10 257/737 |
| 2009/0020758 A1* | 1/2009 | Lee | G02F 1/1368 257/59 |
| 2010/0065852 A1 | 3/2010 | Lin et al. | |
| 2010/0127263 A1 | 5/2010 | Lee et al. | |
| 2011/0019141 A1* | 1/2011 | Yoon | G02F 1/1345 349/138 |
| 2011/0090445 A1* | 4/2011 | Kim | G02F 1/1339 349/139 |
| 2014/0077213 A1* | 3/2014 | Zhang | H01L 29/458 257/59 |
| 2014/0226100 A1 | 8/2014 | Kim et al. | |
| 2014/0268596 A1 | 9/2014 | Chow et al. | |
| 2015/0255740 A1 | 9/2015 | Nakada et al. | |
| 2016/0020422 A1* | 1/2016 | Kim | H01L 51/5228 257/40 |
| 2016/0041644 A1* | 2/2016 | Bae | G06F 3/044 345/174 |
| 2016/0041647 A1* | 2/2016 | Bae | G06F 3/044 345/174 |
| 2016/0163737 A1* | 6/2016 | Guo | H01L 27/1259 257/72 |
| 2016/0240759 A1* | 8/2016 | Chae | H01L 33/36 |
| 2017/0125451 A1* | 5/2017 | Kang | H01L 27/3276 |
| 2017/0288007 A1* | 10/2017 | Shin | H01L 51/56 |
| 2017/0365653 A1* | 12/2017 | Kim | H05K 1/111 |

FOREIGN PATENT DOCUMENTS

| | | |
|---|---|---|
| KR | 1020100112471 A | 10/2010 |
| KR | 1020130007053 A | 1/2013 |

* cited by examiner

DISPLAY PANEL AND DISPLAY DEVICE INCLUDING THE SAME

This application is a divisional application of U.S. patent application Ser. No. 15/827,212, filed on Nov. 30, 2017, which claims priority to Korean Patent Application No. 10-2017-0033872, filed on Mar. 17, 2017, and all the benefits accruing therefrom under 35 U.S.C. § 119, the content of which in its entirety is herein incorporated by reference.

BACKGROUND

1. Field

One or more embodiments relate to a display panel and a display device including the display panel, and more particularly, to a display panel in which a short circuit occurrence rate is reduced in a pad unit thereof, and a display device including the display panel.

2. Description of the Related Art

A display panel is a display unit which displays an image by receiving information about the image. Such a display panel typically includes, at an edge thereof, pads electrically connected to display elements to receive information about an image, etc., and such pads are electrically connected to pads of a printed circuit board, or bumps of electronic elements, etc. The pads of the display panel may be desired to be electrically connected to predetermined pads of the printed circuit board or the bumps of the electronic elements without short circuit between the pads of the display panel.

SUMMARY

In a conventional display panel, adjacent pads therein may be electrically connected to each other and a short circuit may occur.

One or more embodiments include a display panel in which a short circuit occurrence rate is reduced in a pad unit thereof, and a display device including the display panel.

According to one or more embodiments, a display panel includes: a substrate including a display area and a peripheral area outside; and a first conductive layer in the peripheral area, where an entire upper surface of the first conductive layer is exposed to an outside of the display panel, and the first conductive layer includes a main part and a plurality of protrusions protruding from the main part in a direction parallel to an upper surface of the substrate.

In an embodiment, at least a portion of the main part may have a three-layered structure, and at least a portion of a protrusion of the plurality of protrusions may have a two-layered structure.

In an embodiment, the three-layered structure of the at least a portion of the main part may be defined by a lower main layer, an intermediate main layer on the lower main layer, and an upper main layer on the intermediate main layer, and the two-layered structure of the at least a portion of the protrusion may be defined by a lower protrusion layer and an intermediate protrusion layer on the lower protrusion layer.

In an embodiment, the lower main layer and the lower protrusion layer may be integrally formed as a single unitary body, and the intermediate main layer and the intermediate protrusion layer may be integrally formed as a single unitary body.

In an embodiment, an outer side of the intermediate protrusion layer may be closer to a center of the main part than an outer side of the lower protrusion layer is.

In an embodiment, at least a portion of the main part may have a two-layered structure, and at least a portion of a protrusion of the plurality of protrusions may have a single-layered structure.

In an embodiment, the two-layered structure of the at least a portion of the main part may be defined by a lower main layer and an upper main layer on the lower main layer, and the single-layered structure of the at least a portion of the protrusion may be defined by a lower protrusion layer.

In an embodiment, the lower main layer and the lower protrusion layer may be integrally formed as a single unitary body.

In an embodiment, a width of a distal portion of the plurality of protrusions in a direction away from the main part may be greater than a width of a proximal portion of the plurality of protrusions in a direction toward the main part.

In an embodiment, a width of a distal portion of the plurality of protrusions in a direction away from the main part may be less than a width of a proximal portion of the plurality of protrusions in a direction toward the main part.

In an embodiment, at least a portion of the main part may have a multi-layered structure, and at least a portion of a protrusion of the plurality of protrusions may have a multi-layered structure the same as the multi-layered structure of the at least a portion of the main part.

In an embodiment, the display panel may further include a second conductive layer under the first conductive layer and having a shape corresponding to a shape of the main part.

In an embodiment, an orthogonal projection of an edge of the main part onto the substrate may overlap an orthogonal projection of an edge of the second conductive layer in the direction toward the substrate.

In an embodiment, the display panel may further include an insulating layer between the first conductive layer and the second conductive layer, an opening may be defined through the insulating layer, and a central portion of the second conductive layer may directly contact a central portion of the main part via the opening.

In an embodiment, an orthogonal projection of the plurality of protrusions onto the substrate may be located outside an orthogonal projection of an edge of the second conductive layer onto the substrate.

In an embodiment, a width of at least one of the plurality of protrusions may be less than a distance between the first conductive layer and a conductive layer adjacent to the first conductive layer.

According to one or more embodiments, a display device includes: a substrate including a display area and a peripheral area outside the display area; a first conductive layer in the peripheral area, where the first conductive layer includes a main part and a plurality of protrusions protruding from the main part in a direction parallel to an upper surface of the substrate, where an edge of an upper surface of the first conductive layer is not covered by an insulating layer; and a conductive material layer directly contacting the upper surface of the first conductive layer.

In an embodiment, at least a portion of the main part may have a three-layered structure, and at least a portion of a protrusion of the plurality of protrusions may have a two-layered structure.

In an embodiment, the three-layered structure of the at least a portion of the main part may be defined by a lower main layer, an intermediate main layer on the lower main layer, and an upper main layer on the intermediate main layer, and the two-layered structure of the at least a portion of the protrusion may be defined by a lower protrusion layer and an intermediate protrusion layer on the lower protrusion layer.

In an embodiment, the lower main layer and the lower protrusion layer may be integrally formed as a single unitary body, and the intermediate main layer and the intermediate protrusion layer may be integrally formed as a single unitary body.

In an embodiment, an outer side of the intermediate protrusion layer may be closer to a center of the main part than an outer side of the lower protrusion layer is.

In an embodiment, at least a portion of the main part may have a two-layered structure, and at least a portion of a protrusion of the plurality of protrusions may have a single-layered structure.

In an embodiment, the two-layered structure of the at least a portion of the main part may be defined by a lower main layer and an upper main layer on the lower main layer, and the single-layered structure of at least a portion of the protrusion may be defined by a lower protrusion layer.

In an embodiment, the lower main layer and the lower protrusion layer may be integrally formed as a single unitary body.

In an embodiment, a width of a distal portion of the plurality of protrusions in a direction away from the main part may be greater than a width of a proximal portion of the plurality of protrusions in a direction toward the main part.

In an embodiment, a width of a distal portion of the plurality of protrusions in a direction away from the main part may be less than a width of a proximal portion of the plurality of protrusions in a direction toward the main part.

In an embodiment, at least a portion of the main part may have a multi-layered structure, and at least a portion of a protrusion of the plurality of protrusions may have a multi-layered structure the same as the multi-layered structure of the main part.

In an embodiment, the display panel may further include a second conductive layer under the first conductive layer and having a shape corresponding to a shape of the main part.

In an embodiment, an orthogonal projection of an edge of the main part onto the substrate may overlap an orthogonal projection of an edge of the second conductive layer onto the substrate.

In an embodiment, the display panel may further include an insulating layer between the first conductive layer and the second conductive layer, an opening may be defined through the insulating layer, and a central portion of the second conductive layer may directly contact a central portion of the main part via the opening.

In an embodiment, an orthogonal projection of the plurality of protrusions onto the substrate may be located outside an orthogonal projection of an edge of the second conductive layer onto the substrate.

In an embodiment, a width of at least one of the plurality of protrusions may be less than a distance between the first conductive layer and a conductive layer adjacent to the first conductive layer.

In an embodiment, the conductive material layer may be a conductive adhesive layer.

In an embodiment, the conductive adhesive layer may cover an entire upper surface of at least one of the plurality of protrusions.

In an embodiment, the conductive material layer may be a bump of an electronic element or a pad of a printed circuit board.

In an embodiment, the conductive material layer may be a portion of an integrated circuit element.

According to embodiments of the invention, a display panel in which a short circuit occurrence rate is reduced in a pad unit thereof, and a display device including the display panel may be implemented.

BRIEF DESCRIPTION OF THE DRAWINGS

These and/or other features will become apparent and more readily appreciated from the following description of the embodiments, taken in conjunction with the accompanying drawings, in which.

DETAILED DESCRIPTION

Figure 1:
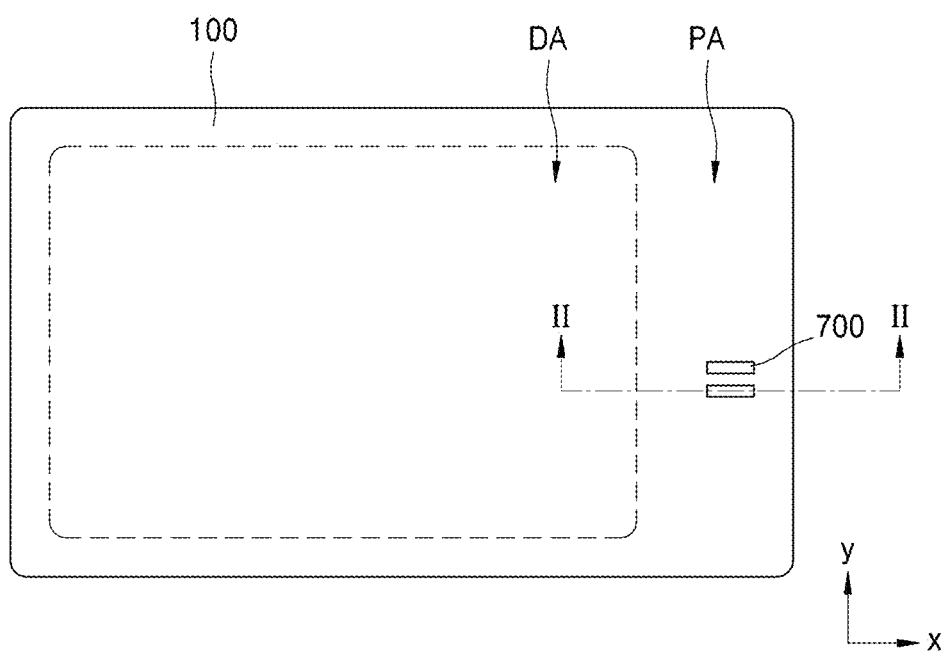
FIG. 1 is a plan view of a display panel according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

In the following description, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 2:
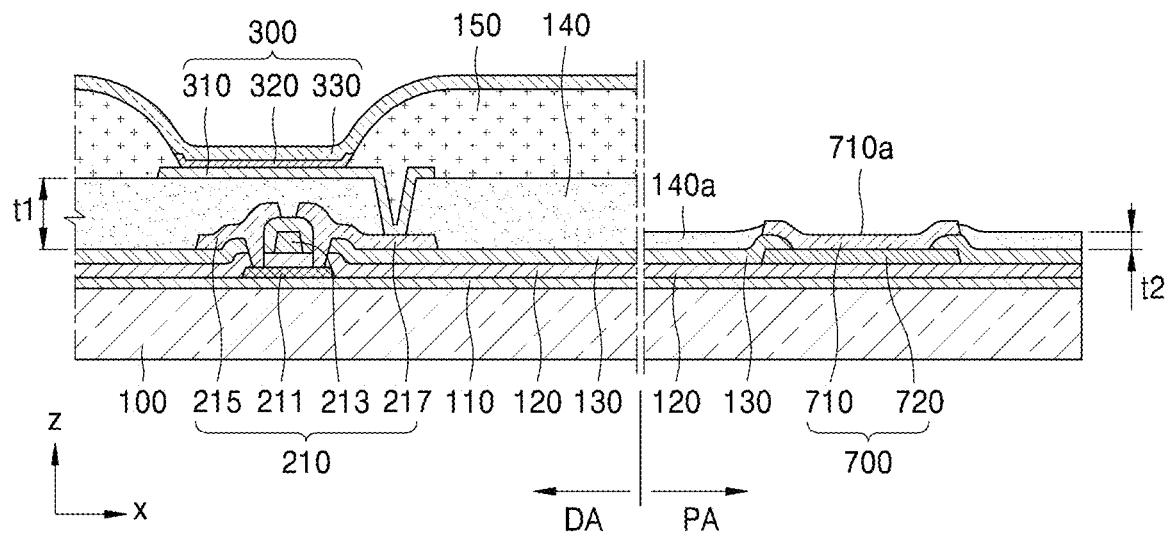
FIG. 2 is a cross-sectional view taken along line II-II of FIG. 1.

FIG. 1 is a plan view of a display panel according to an embodiment, and FIG. 2 is a cross-sectional view taken along line II-II of FIG. 1. FIG. 2 illustrates the display panel which is an organic light-emitting display panel including an organic light-emitting device 300.

In an embodiment, the display panel includes a substrate 100 including a display area DA and a peripheral area PA outside the display area DA, the peripheral area PA being a non-display area. In an embodiment, as shown in FIG. 2, a plurality of organic light-emitting devices 300, which are display elements, are arranged in the display area DA on the substrate 100. The substrate 100 may include at least one of various materials such as a glass material, a metal material and a plastic material, for example.

In such an embodiment, a thin film transistor 210 is arranged in the display area DA of the substrate 100. In such an embodiment, the organic light-emitting device 300 electrically connected to the thin film transistor 210 may be arranged in the display area DA. The organic light-emitting device 300 may be electrically connected to the thin film transistor 210 via a pixel electrode 310 which is electrically connected to the thin film transistor 210. Alternatively, a thin film transistor may be arranged in the peripheral area PA of the substrate 100. The thin film transistor arranged in the peripheral area PA may be, for example, a part of a circuit for controlling an electrical signal to be applied into the display area DA.

The thin film transistor 210 includes a semiconductor layer 211, a gate electrode 213, a source electrode 215, and a drain electrode 217. The semiconductor layer 211 includes amorphous silicon, polycrystalline silicon, or an organic semiconductor material. In an embodiment, a buffer layer 110 including a silicon oxide, a silicon nitride, or the like may be arranged on the substrate 100 to planarize a surface of the substrate 100 or to prevent impurities, etc. from penetrating into the semiconductor layer 211. The semiconductor layer 211 may be arranged on the buffer layer 110.

The gate electrode 213 is disposed over the semiconductor layer 211 on the buffer layer 110. The source electrode 215 and the drain electrode 217 are electrically connected to each other in response to a signal applied to the gate electrode 213. The gate electrode 213 may have a single layer structure, or a multi-layer structure including, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), taking into account an adhesive property between the gate electrode 213 and a layer adjacent thereto, a surface smoothness of a surface of a layer to be stacked thereon, processability, etc. In such an embodiment, a gate insulating layer 120 including silicon oxide and/or a silicon nitride may be arranged between the semiconductor layer 211 and the gate electrode 213 to secure an insulating property between the semiconductor layer 211 and the gate electrode 213.

An interlayer insulating layer 130 may be disposed on the gate electrode 213. The interlayer insulating layer 130 may have a single layer structure, or a multi-layer structure including a silicon oxide, a silicon nitride, or the like.

The source electrode 215 and the drain electrode 217 are disposed on the interlayer insulating layer 130. The source electrode 215 and the drain electrode 217 are electrically connected to the semiconductor layer 211 via respective contact holes defined in the interlayer insulating layer 130 and in the gate insulating layer 120. The source electrode 215 and the drain electrode 217 may have a single layer structure or a multi-layer structure including, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), taking into account a conductive property, etc. A protective film (not shown) may be disposed to cover the thin film transistor 210 to protect the thin film transistor 210 described above. The protective film may include, for example, an inorganic material such as a silicon oxide, a silicon nitride, a silicon oxynitride, etc. The protective film may have a single layer structure or a multi-layer structure.

A planarization layer 140 may be disposed over the protective film. In one embodiment, for example, as illustrated in FIG. 2, when the organic light-emitting device 300 is disposed over the thin film transistor 210, the planarization layer 140 may planarize an upper portion of the protective film covering the thin film transistor 210. The planarization layer 140 may include, for example, an organic material such as an acryl, benzocyclobutene ("BCB"), or hexamethyldisiloxane ("HMDSO"). In an embodiment, as shown in FIG. 2, the planarization layer 140 may have a single layer, but embodiments are not limited thereto. Alternatively, the planarization layer 140 may have a multi-layer structure.

In an embodiment, the display device may include both the protective film and the planarization layer 140, or may include only one of the protective film and the planarization layer 140.

In the display area DA of the substrate 100, the organic light-emitting device 300 is disposed on the planarization layer 140. The organic light-emitting device 300 includes the pixel electrode 310, an opposite electrode 330, and an intermediate layer 320 between the pixel electrode 310 and the opposite electrode 330 and including an emission layer.

An opening is defined in the planarization layer 140 to expose at least one of the source electrode 215 and the drain electrode 217 of the thin film transistor 210. The pixel electrode 310 is provided on the planarization layer 140. The pixel electrode 310 is electrically connected to the thin film transistor 210 by contacting one of the source electrode 215 and the drain electrode 217 via the opening. The pixel electrode 310 may be a transparent (or semi-transparent) electrode, or may be a reflective electrode. When the pixel electrode 310 is the transparent (or semi-transparent) electrode, the pixel electrode 310 may include, for example, indium tin oxide ("ITO"), indium zinc oxide ("IZO"), ZnO, $In_2O_3$, indium gallium oxide ("IGO"), and/or aluminum zinc oxide ("AZO"). In an embodiment, where the pixel electrode 310 is the reflective electrode, the pixel electrode 310 may include a reflective film including Ag, Mg, Al, Pt, Pd, Au, Ni, Nd, Ir, Cr, or a compound thereof, and a layer including ITO, IZO, ZnO, $In_2O_3$, IGO, or AZO. However, embodiments are not limited thereto. In an alternative embodiment, the pixel electrode 310 may include various materials, and may have any of various structures, e.g., a single layer structure or a multi-layer structure.

A pixel-defining film 150 may be disposed on the planarization layer 140. The pixel-defining film 150 defines a pixel with openings defined therein to correspond to respective sub-pixels, that is, openings exposing at least a central portion of the pixel electrode 310. In an embodiment, as illustrated in FIG. 2, the pixel-defining film 150 effectively prevents an arc, etc. from occurring at an edge of the pixel electrode 310 by increasing a distance between the edge of the pixel electrode 310 and the opposite electrode 330 over the pixel electrode 310. The pixel-defining film 150 may include, for example, an organic material such as polyimide ("PI") or HMDSO.

The intermediate layer 320 of the organic light-emitting device 300 may include a low molecular weight material, or a high molecular weight material. In an embodiment, where the intermediate layer 320 includes the low molecular weight material, the intermediate layer 320 may have a stacked structure including at least one of a hole injection layer ("HIL"), a hole transport layer ("HTL"), an emission layer ("EML"), an electron transport layer ("ETL"), an electron injection layer ("EIL"), etc., and may include various organic materials, such as copper phthalocyanine ("CuPc"), N,N'-Di(naphthalene-1-yl)-N,N'-diphenyl-benzidine ("NPB"), tris-8-hydroxyquinoline aluminum ("Alq3"), etc. Such layers may be formed by vacuum deposition.

In an embodiment, where the intermediate layer 320 includes the high molecular weight material, the intermediate layer 320 may have a structure including an HTL and an EML. In such an embodiment, the HTL may include PEDOT, and the EML may include a polymeric material, such as poly-phenylenevinylene ("PPV")-based polymeric material, a polyfluorene-based polymeric material, etc. The intermediate layer 320 may be formed by screen printing, inkjet printing, laser induced thermal imaging ("LITI"), etc.

However, the intermediate layer 320 is not limited thereto, and may have any of various other structures.

In an embodiment, the opposite electrode 330 is disposed over the top of the display area DA, and may be arranged to cover the display area DA, as illustrated in FIG. 2. In such an embodiment, the opposite electrode 330 may be integrally formed as a single unitary (and indivisible) body over the plurality of the organic light-emitting devices 300 and thus correspond to the plurality of organic light-emitting devices 300. The opposite electrode 330 may be a transparent (or semi-transparent) electrode, or may be a reflective electrode. In an embodiment, where the opposite electrode 330 is the transparent (or semi-transparent) electrode, the opposite electrode 330 may include a layer including a metal including a small work function (i.e., Li, Ca, LiF/Ca, LiF/Al, Al, Ag, Mg, or a compound thereof), and a transparent (semi-transparent) conductive layer including ITO, IZO, ZnO, $In_2O_3$, or the like. In an embodiment, where the opposite electrode 330 is the reflective electrode, the opposite electrode 330 may include a layer of a sufficient thickness including Li, Ca, LiF/Ca, LiF/Al, Al, Ag, Mg, or a compound thereof. However, the opposite electrode 330 is not limited to the above structures and materials, and may be embodied in various different forms.

In an embodiment, as shown in FIG. 2, the display panel includes the organic light-emitting device 300 as a display element, but embodiments are not limited thereto. In one alternative embodiment, for example, the display element of the display panel includes a liquid crystal layer instead of the organic light-emitting device 300. In another alternative embodiment, the display panel may include a display element other than a display element including the organic light-emitting device 300 or the liquid crystal.

A plurality of pads 700 are arranged in the peripheral area PA of the substrate 100 as illustrated in FIG. 1. For convenience of illustration and description, FIG. 1 illustrates only two pads 700, the embodiments are not limited thereto, and three or more pads 700 may be arranged adjacent to each other.

In an embodiment, each of the pads 700, as illustrated in FIG. 2, may include a first conductive layer 710 and a second conductive layer 720. The first conductive layer 710 is disposed in a same layer as the source electrode 215 and the drain electrode 217, that is, on the interlayer insulating layer 130. The second conductive layer 720 is disposed in a same layer as the gate electrode 213, that is, on the gate insulating layer 120. In an embodiment, the first conductive layer 710 may include a same material as the source electrode 215 and the drain electrode 217 and may be formed simultaneously with the source electrode 215 and the drain electrode 217 during a same manufacturing process. In an embodiment, the second conductive layer 720 under the first conductive layer 710 may include a same material as the gate electrode 213 and may be formed simultaneously with the gate electrode 213 during a same manufacturing process. In an embodiment, where the interlayer insulating layer 130 is between the first conductive layer 710 and the second conductive layer 720, an opening corresponding to a central portion of the second conductive layer 720 may be defined through the interlayer insulating layer 130. In such an embodiment, the first conductive layer 710 may directly contact the second conductive layer 720 via the opening.

Each of a plurality of first conductive layers 710 includes an upper surface 710a entirely exposed to an outside atmosphere. In such an embodiment, a pad division layer 140a between the first conductive layers 710 is disposed only between the first conductive layers 710 and may not cover the upper surface 710a of each of the first conductive layers 710 to expose the upper surface 710a of each first conductive layer 710 when the first conductive layers 710 is disposed on a corresponding second conductive layer 720. Though the pad division layer 140a has a thickness t2 different from a thickness t1 of the planarization layer 140, the pad division layer 140a may include a same material as the planarization layer 140 and may be formed simultaneously with the planarization layer 140 during a same manufacturing process.

In an alternative embodiment, the first conductive layer 710 and/or the second conductive layer 720 may extend in a direction of the display area DA of the substrate 100 and may be electrically connected to the thin film transistor 210, etc. within the display area DA.

Figure 3:
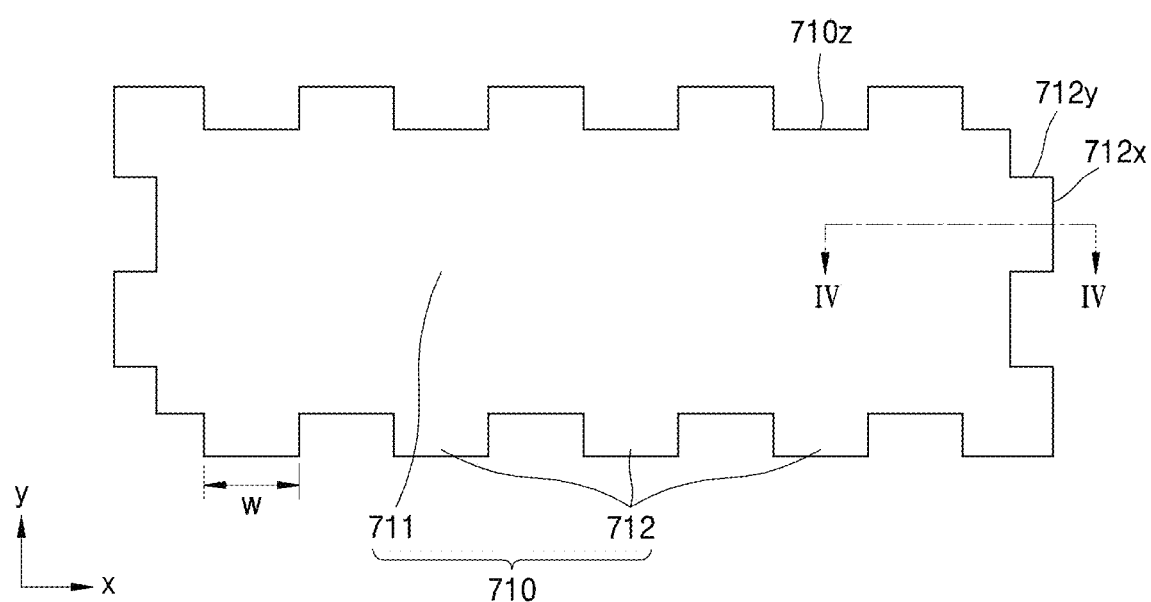
FIG. 3 is a plan view of a first conductive layer of FIGS. 1 and 2.
Figure 4:
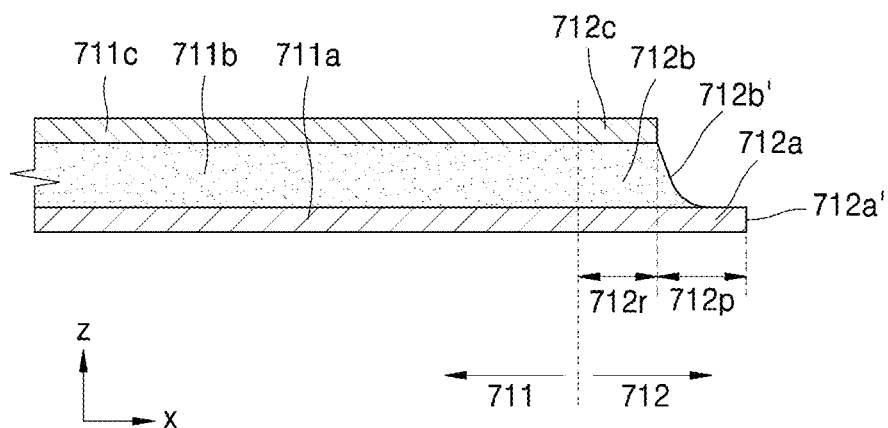
FIG. 4 is a cross-sectional view taken along line IV-IV of FIG. 3.

FIG. 3 is a plan view of the first conductive layer 710 of FIGS. 1 and 2, and FIG. 4 is a cross-sectional view taken along line IV-IV of FIG. 3.

In an embodiment, as illustrated in FIG. 3, the first conductive layer 710 includes a main part 711 and a plurality of protrusions 712. The protrusions 712 are shaped to protrude from the main part 711 having an approximately rectangular shape in a direction approximately parallel to an upper surface of the substrate 100. Occurrence of a short circuit between adjacent first conductive layers 710 may be effectively prevented during a manufacturing process by allowing the first conductive layer 710 to be shaped in such a manner.

The source electrode 215 and the drain electrode 217 of the thin film transistor 210, and the first conductive layer 710 may be formed by forming conductive layers having a multi-layer structure and patterning the formed conductive layers. In one embodiment, for example, where the first conductive layer 710 has a three-layered structure, conductive layers having a three-layered structure are formed and patterned to form the first conductive layer 710. During the patterning process, a portion to be removed is removed by etching the conductive layers having the multi-layered structure. Etching rates may be different in some of the conductive layers having the multi-layered structure. In one embodiment, for example, where conductive layers having a three-layered structure has a structure in which an aluminum layer is arranged between two titanium layers, an etching rate of the aluminum layer is greater than an etching rate of the two titanium layers. Therefore, when the first conductive layer 710 is formed by forming a stacked structure of the titanium layer, the aluminum layer and the titanium layer, and etching the stacked structure, the aluminum layer is etched further than the titanium layer at the edge of the first conductive layer 710, and thus an edge of the aluminum layer becomes closer to a center of the first conductive layer 710 than an edge of the titanium layers.

In an embodiment, when the first conductive layer 710 is formed by forming the conductive layers having the three-layered structure and etching the three-layered structure, the main part 711 of the first conductive layer 710 may include a lower main layer 711a, an intermediate main layer 711b on the lower main layer 711a, and an upper main layer 711c on the intermediate main layer 711b as illustrated in FIG. 4. In one embodiment, for example, the lower main layer 711a and the upper main layer 711c may include titanium, and the intermediate main layer 711b may include aluminum.

In such an embodiment, at least one of the protrusions 712 may have only a two-layered structure in at least a portion 712p thereof and may have a three-layered structure in a residual portion 712r, which is adjacent to the main part 711 as illustrated in FIG. 4. In such an embodiment, at least the portion 712p may have a lower protrusion layer 712a and an intermediate protrusion layer 712b on the lower protrusion layer 712a, and the residual portion 712r may have the lower protrusion layer 712a, the intermediate protrusion layer 712b on the lower protrusion layer 712a, and an upper protrusion layer 712c on the intermediate protrusion layer 712b. In one embodiment, for example, the lower protrusion layer 712a and the upper protrusion layer 712c may include titanium, and the intermediate protrusion layer 712b may include aluminum.

In such an embodiment, as illustrated in FIG. 4, the protrusion 712 has the two-layered structure, not the three-layered structure in at least a portion thereof. This is because a portion of the upper protrusion layer 712c may be lost during a manufacturing process of the display panel.

Figure 14:
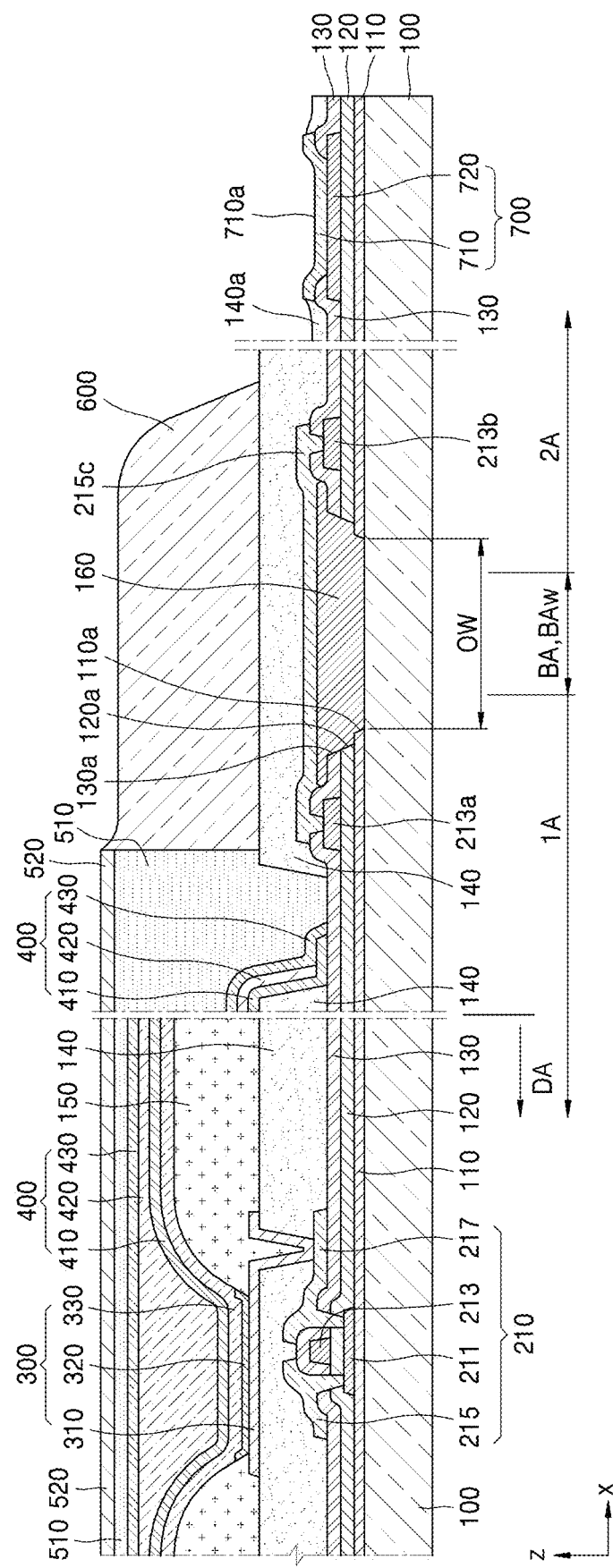
FIG. 14 is a cross-sectional view of the portion of the display panel of FIG. 13.

During a process of manufacturing the display panel illustrated in FIGS. 1 and 2, elements in the display area DA may be protected from external moisture or impurities, etc., by covering the elements in the display area DA with an encapsulation layer (not shown, refer to reference numeral 400 of FIG. 14). Elements in the peripheral area PA may be also protected from external moisture or impurities, etc., by covering the elements in the peripheral areas PA with the encapsulation layer (not shown). However, in the case of the pad 700 to which an electrical signal, etc., to be transferred to the display area DA to be applied, since an electronic device or a printed circuit board ("PCB"), etc. are electrically connected to the pad 700 afterwards, the pad 700 is not covered by the encapsulation layer, etc. In such an embodiment, after the pad 700, etc., are formed, a temporary protective film may be attached to the pad 700 to protect the pad 700 temporarily.

The temporary protective film is detached afterwards when desired. When the temporary protective film is detached, the upper protrusion layer 712c may be lost in at least the portion 712p of the protrusion 712, and thus the protrusion 712 may have a two-layered structure, not a three-layered structure in at least the portion 712p. This is because an etching rate of the intermediate protrusion layer 712b is higher than an etching rate of the upper protrusion layer 712c or the lower protrusion layer 712a and thus the intermediate protrusion layer 712b may not be left under the upper protrusion layer 712c at an edge of the protrusion 712, and in this case, the upper protrusion layer 712c corresponding to the relevant portion may be lost during an attachment/detachment process of the temporary protective film.

If the first conductive layer 710 does not have the protrusions 712 but has only the main part 711 having an approximately rectangular shape, an uppermost layer may be lost along an edge of the main part 711. In this case, for example, in the case where an uppermost layer is lost along a long edge of the main part 711 in +x direction, the lost portion may be a conductive material having a long rod shape. In this case, the long rod-shaped conductive material may extend over adjacent first conductive layers 710 (in +y direction or −y direction) and thus cause a short circuit at the adjacent first conductive layers 710.

Accordingly, in an embodiment of the display panel according to the invention, the first conductive layer 710 includes the main part 711 and the plurality of protrusions 712. In such an embodiment, as illustrated in FIG. 3, the first conductive layer 710 has an approximately zigzag shape at edges thereof. In such an embodiment, even when an uppermost layer is lost along the edge of the first conductive layer 710, the lost portion is cut into a plurality of small conductive materials. In such an embodiment, because a first side 712x and a second side 712y at an edge of the first conductive layer 710 may have a bent form, not a straight line form as illustrated in FIG. 3, and thus the first side 712x and the second side 712y are easily cut off from each other at the bent portion even when the uppermost layer is lost along the edge of the first conductive layer 710. Since the plurality of cut small conductive materials is small in size, such cut small conductive materials may not cause a short circuit at the adjacent first conductive layers 710. Therefore, in such an embodiment of the display panel, a defect rate may be substantially reduced during a manufacturing process.

In such an embodiment, a width w of at least one of the protrusions 712 may be made smaller than a distance between the adjacent first conductive layers 710 to prevent a short circuit at the adjacent first conductive layers 710. In such an embodiment, each of the protrusions 712 may be made smaller than a distance between the adjacent first conductive layers 710. In such an embodiment, the distance between the adjacent first conductive layers 710 may be defined as a distance (a minimum distance) between edges of two adjacent first conductive layers 710 facing each other, not a distance between centers of the adjacent two first conductive layers 710. That is, the distance between the adjacent first conductive layers 710 may be defined as a width of a space between the two adjacent first conductive layers 710. In such an embodiment, even when an uppermost layer is lost along the first side 712x which is a portion of the protrusion 712 at an edge of the first conductive layer 710, a length of a small conductive material formed by cutting the protrusion 712 corresponds to the width w of the protrusion 712. Therefore, since a length of the small conductive material is smaller than the distance between the adjacent first conductive layers 710, occurrence of a short circuit between the adjacent first conductive layers 710 may be effectively prevented. In such an embodiment, the same or similar effect may be pursued by making a distance between the protrusions 712 smaller than the distance between the adjacent first conductive layers 710.

In an embodiment of the display panel, as illustrated in FIG. 4, an end surface 712b' of the intermediate protrusion layer 712b may be relatively closer to a central portion (−x direction) of the first conductive layer 710 than an end surface 712a' of the lower protrusion layer 712a in the protrusion 712. In such an embodiment, since the main part 711 and the protrusion 712 of the first conductive layer 710 are not separately formed but simultaneously formed by using a same material during a same manufacturing process, the lower main layer 711a and the lower protrusion layer 712a are integrally formed as a single unitary body, and the intermediate main layer 711b and the intermediate protrusion layer 712b are formed as single unitary body.

Figure 5:
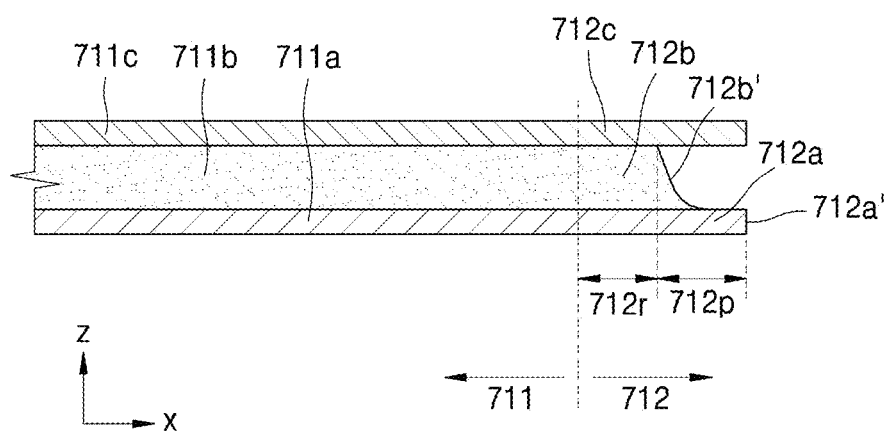
FIG. 5 is a cross-sectional view of a first conductive layer of a display panel according to an alternative embodiment.

In such an embodiment, as illustrated in FIG. 5, which is a cross-sectional view of the first conductive layer of the display panel according to another embodiment, at least one of the protrusions 712 may have a multi-layered structure that same as that of the main part 711. In one embodiment, for example, where the main part 711 has a three-layered structure, at least some of the protrusions 712 may have the same three-layered structure.

In an embodiment, as described above, conductive layers of a three-layered structure are formed and then patterned to form the first conductive layer 710. In such an embodiment, an etching rate of a layer arranged in the middle portion between the upper and lower portions is higher than an etching rate of layers arranged in the upper and lower portions, and thus an end surface of the layer arranged in the middle may be relatively closer to a central portion of the first conductive layer 710 than an end surface of the layers arranged in the upper and lower portions in an edge of the first conductive layer 710. Accordingly, FIG. 5 illustrates that an end surface 712b' of the intermediate protrusion layer 712b is relatively closer to a central portion (−x direction) of the first conductive layer 710 than an end surface 712a' of the lower protrusion layer 712a of the protrusion 712. Therefore, an empty space may be formed under the upper protrusion layer 712c at the portion 712p of the protrusion 712.

However, in an embodiment of the display panel, the upper protrusion layer 712c may not be lost in some of the protrusions 712 because the first side 712x and the second side 712y have a bent form, not a straight line form, at the edge of the first conductive layer 710, as described above with reference to FIG. 3, and thus uppermost layers may be easily cut off from each other at the bent portion even when the uppermost layers are lost along the edge of the first conductive layer 710. In such an embodiment, since the uppermost layers are cut off from each other at the portion defined by bent side lines even when the uppermost layers are lost along the edge of the first conductive layer 710, an uppermost layer may remain along an edge of the first conductive layer 710 in some of the protrusions 712.

A third side 710z (see FIG. 3) of the first conductive layer 710, which may be an edge of the main part 711 between the protrusions 712, may have the same layered structure as that of the portion 712p having only the two-layered structure among the portions of the protrusion 712 of FIG. 4. However, as described above, since the first side 712x, the second side 712y and the third side 710z have bent form, not straight line forms at the edges of the first conductive layer 710, even when uppermost layers are lost along the edges of the first conductive layer 710, the uppermost layers may be easily cut off from each other at the portions defined by the bent side lines. Therefore, occurrence of a short circuit at adjacent pads 700 may be effectively prevented.

Figure 6:
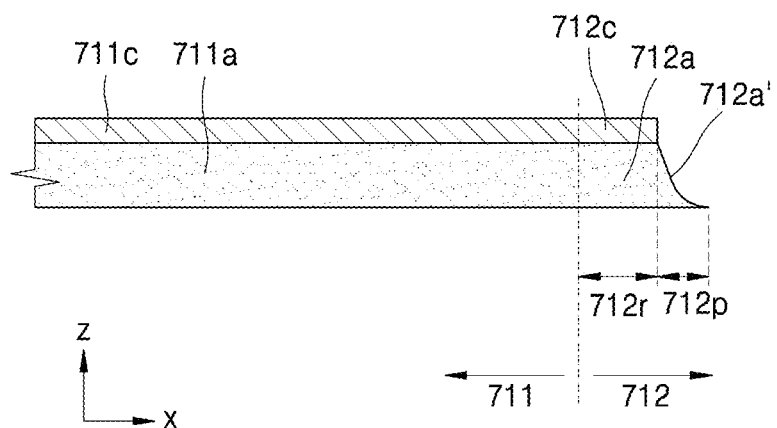
FIG. 6 is a cross-sectional view of a first conductive layer of a display panel according to another alternative embodiment.

Although embodiments where the first conductive layer 710 has a three-layered structure has been described above, the embodiments are not limited thereto. In one alternative embodiment, for example, as illustrated in FIG. 6, which is a cross-sectional view of a first conductive layer of a display panel, the main part 711 may have a two-layered structure including the lower main layer 711a and the upper main layer 711c, and at least one of the protrusions 712 may have only the lower protrusion layer 712a in at least the portion 712p to have only a one-layered structure. In such an embodiment, the protrusion 712 may have the lower protrusion layer 712a and the upper protrusion layer 712c in the residual portion 712r thereof in a direction of the main part 711.

Figure 7:
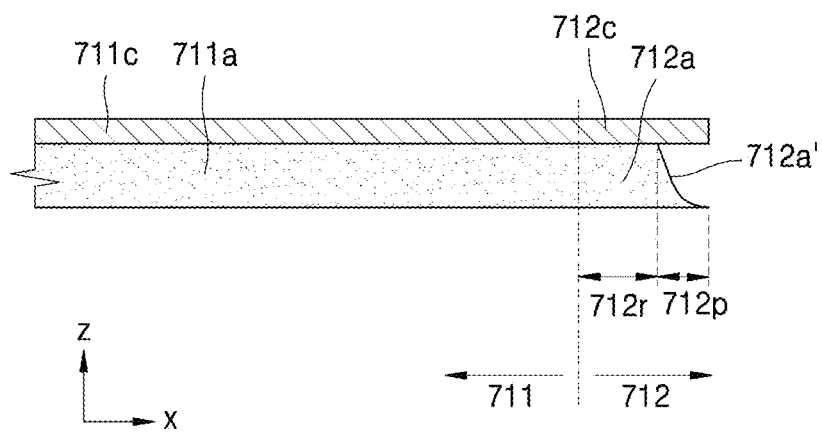
FIG. 7 is a cross-sectional view of a first conductive layer of a display panel according to still another alternative embodiment.

Even in this case, by allowing a plan view of the first conductive layer 710 to have the structure illustrated in FIG. 3, occurrence of a short circuit at adjacent pads 700 may be effectively prevented by allowing uppermost layers to be easily cut off from each other at the portion defined by the bent side lines even when the uppermost layers are lost along an edge of the first conductive layer 710. The lower main layer 711a and the lower protrusion 712a may integrally be formed as a single unitary body. In an alternative embodiment, as illustrated in FIG. 7, which is a cross-sectional view of a first conductive layer of a display panel at least one protrusion 712 may have the same two-layered structure as that of the main part 711, as in the embodiments described above with reference to FIG. 5.

Figure 8:
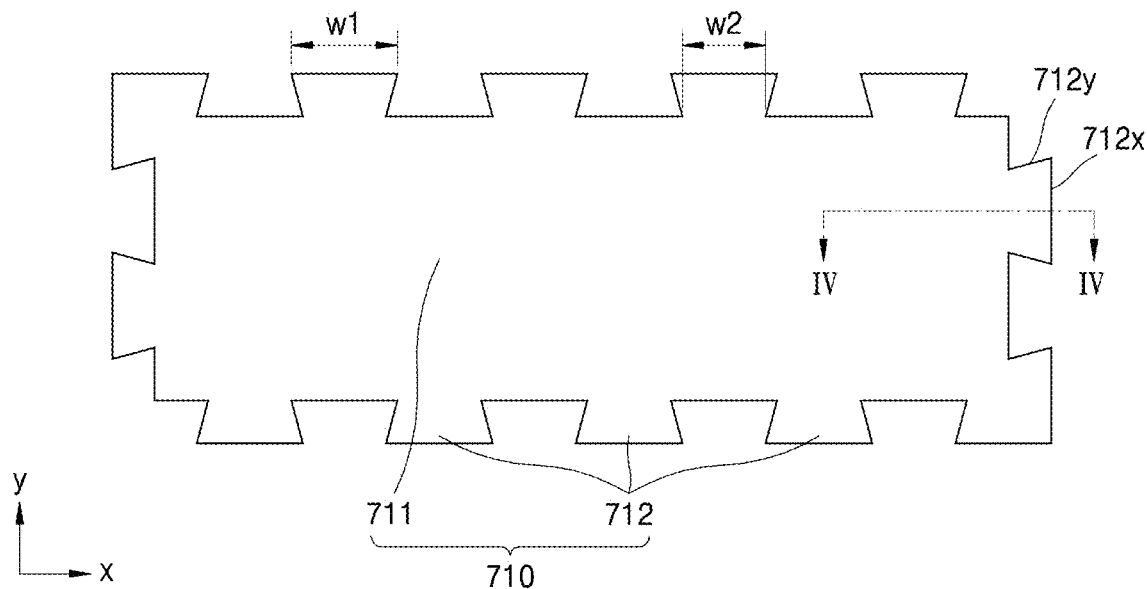
FIG. 8 is a plan view of a first conductive layer of a display panel according to another alternative embodiment.

FIG. 8 is a plan view of a first conductive layer of a display panel according to an alternative embodiment. In such an embodiment of the display panel, a width w1 of a distal portion of the plurality of protrusions 712 in a direction away from the main part 711 is greater than a width w2 of a proximal portion of the plurality of protrusions 712 in a direction toward the main part 711.

In such an embodiment of the display panel, the first side 712x and the second side 712y in an edge of the first conductive layer 710 have a bent form or collectively define a bent side line, not a straight line form (i.e., not linearly aligned), and further, an angle formed by the first side 712x and the second side 712y may be an acute angle. Consequently, even when an uppermost layer is lost along the edge of the first conductive layer 710, since an angle of the portion defined by bent side lines is a pointed acute angle, the uppermost layer at that portion may be more easily cut off. In such an embodiment, a cross-section taken along line IV-IV of the first conductive layer 710 of FIG. 8 may be substantially the same as that described above with reference to FIG. 4, and that described above with reference to FIGS. 5 to 7, and any repetitive detailed description thereof will be omitted.

Figure 9:
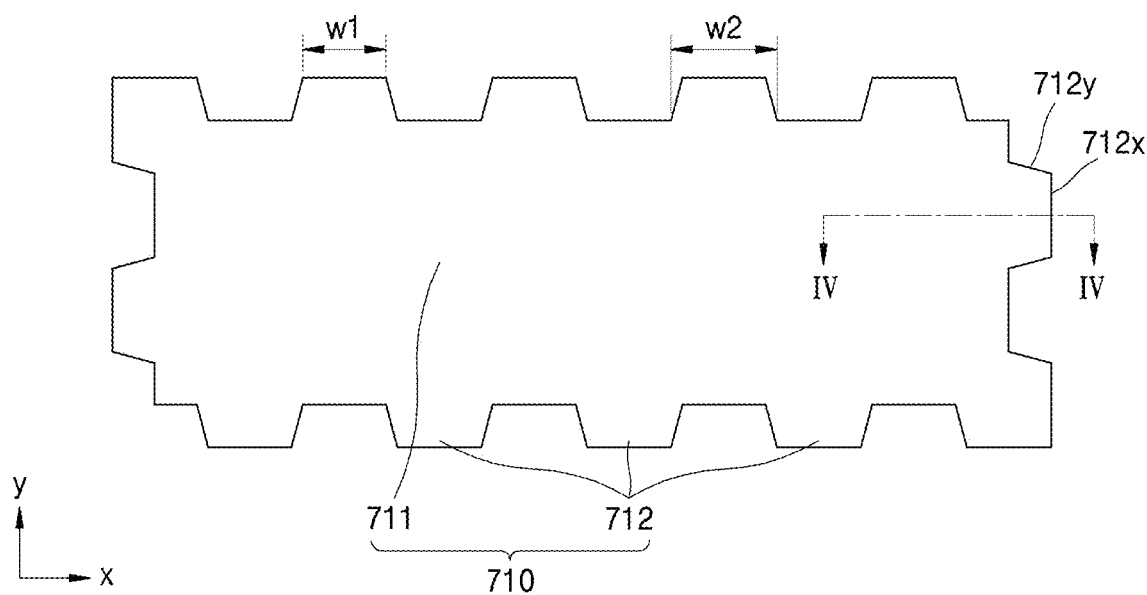
FIG. 9 is a plan view of a first conductive layer of a display panel according to yet another alternative embodiment.

FIG. 9 is a plan view of a first conductive layer of a display panel according to another alternative embodiment. In such an embodiment of the display panel, a width w1 of a distal portion of the plurality of protrusions 712 in a direction away from the main part 711 is less than a width w2 of a proximal portion of the plurality of protrusions 712 in a direction toward the main part 711.

A portion of the protrusions 712 in which a probability that an uppermost layer thereof will be lost is high is an uppermost layer arranged in a distal portion in a direction away from the main part 711, that is, an uppermost layer of the first side 712x. Since an uppermost layer of the second side 712y is adjacent to an uppermost layer of the main part 711, the uppermost layer of the second side 712y is connected to the uppermost layer of the main part 711 and thus a probability that the uppermost layer of the second side 712y is not lost is high. Therefore, occurrence of a short circuit between adjacent first conductive layers 710 may be effectively prevented by reducing a size of an uppermost layer arranged at the distal portion, and having a high probability that the uppermost layer will be lost even when the portion of the uppermost layer is lost. In such an embodiment, a cross-section taken along line IV-IV of the first conductive layer 710 of FIG. 9 may be substantially the same as that described above with reference to FIG. 4 and that described above with reference to FIGS. 5 to 7, and any repetitive detailed description thereof will be omitted.

Figure 10:
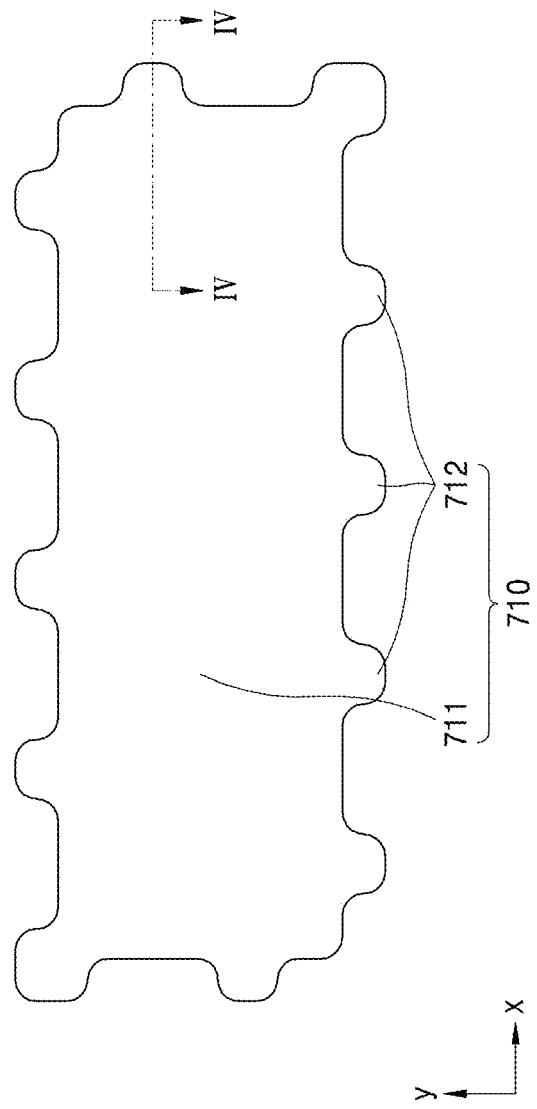
FIG. 10 is a plan view of a first conductive layer of a display panel according to yet another alternative embodiment.

In an embodiment, the protrusions 712 of the first conductive layer 710 may not have a pointed form when viewed from a plan view in a direction approximately perpendicular to the substrate 100. In one embodiment, for example, as illustrated in FIG. 10, which is a plan view of a first conductive layer 710 of a display panel according to another alternative embodiment, the protrusions 712 may have a smooth curve-shaped edge without being pointed, when viewed from a plan view. In such an embodiment, an edge of a portion at which the main part 711 is connected to the protrusion 712 may have a smooth-curved shape, as shown in FIG. 10. In such an embodiment, a cross-section taken along line IV-IV of FIG. 10 may be the same as that described above with reference to FIG. 4 or may have a form modified therefrom. In such an embodiment, an edge of the first conductive layer 710 may have a smooth form without a pointed portion, when viewed a plan view viewed in a direction approximately perpendicular to the substrate 100.

Figure 11:
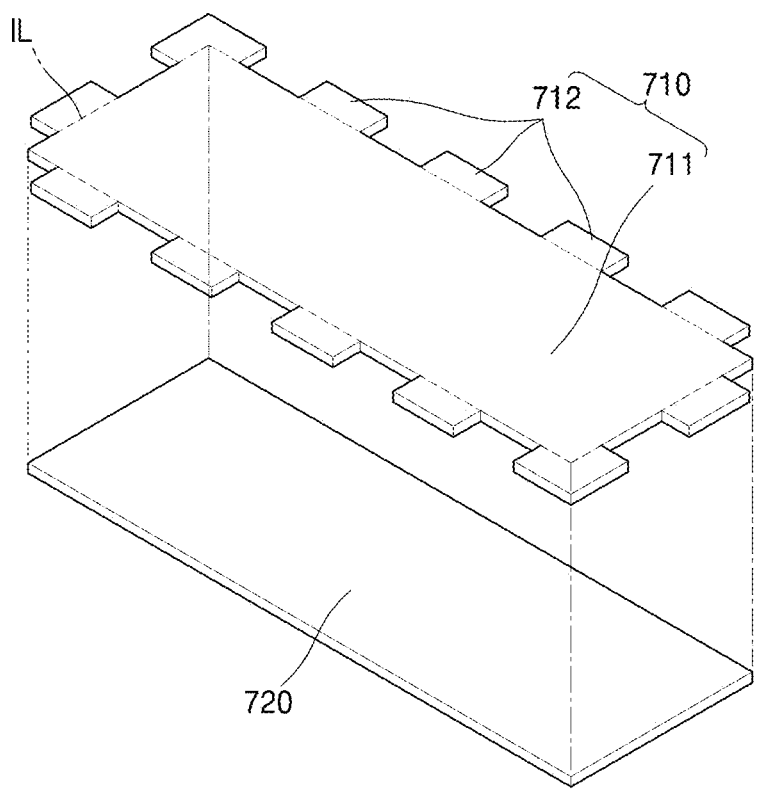
FIG. 11 is an exploded perspective view of a first conductive layer and a second conductive layer of a display panel according to an embodiment.

FIG. 11 is an exploded perspective view of the first conductive layer 710 and the second conductive layer 720 of a display panel according to an embodiment. For convenience of illustration, FIG. 11 illustrates that the first conductive layer 710 has a flat form, rather than having curved portions.

In an embodiment, as illustrated in FIG. 11, an edge of the main part 711 of the first conductive layer 710 may be represented by an imaginary line IL. In such an embodiment, an orthogonal projection of an edge of the main part 711 of the first conductive layer 710 onto a substrate (not shown) (arranged in −z direction) may overlap an orthogonal projection of an edge of the second conductive layer 720 onto the substrate, arranged (−z direction) under the first conductive layer 710 and having a shape corresponding to the main part 711. In an alternative embodiment, an orthogonal projection of the protrusions 712 of the first conductive layer 710 onto the substrate may be arranged outside an orthogonal projection of an edge of the second conductive layer 720 onto the substrate. In such an embodiment, an area of contact between the first conductive layer 710 and the second conductive layer 720 may be sufficient.

Figure 12:
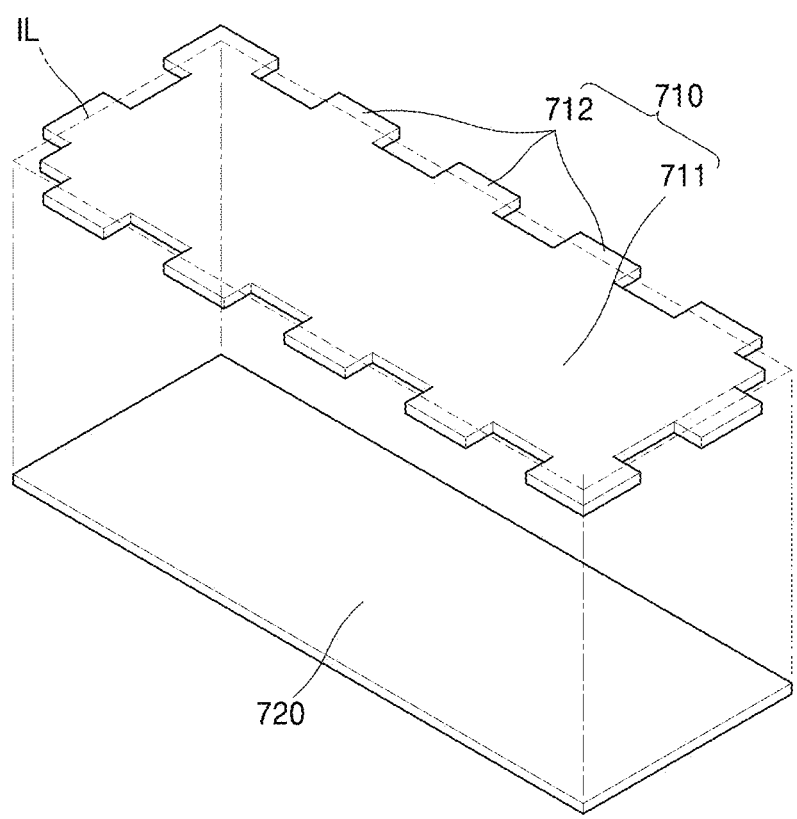
FIG. 12 is an exploded perspective view of a first conductive layer and a second conductive layer of a display panel according to an alternative embodiment.

In an embodiment, as illustrated in FIG. 12, which is an exploded perspective view of the first conductive layer 710 and the second conductive layer 720 of the display panel according to an alternative embodiment, an edge of the second conductive layer 720 may be arranged outside the main part 711 of the first conductive layer 710 and may be arranged in the vicinity of a center of each of the protrusions 712. In such an embodiment, the second conductive layer 720 may have an area greater than that of the main part 711 of the first conductive layer 710, and an orthogonal projection of an edge of the protrusions 712 of the first conductive layer 710 in a direction farthest away from the main part 711 onto the substrate may be arranged outside an orthogonal projection of an edge of the second conductive layer 720 onto the substrate. For convenience of illustration, FIG. 12 illustrates that the first conductive layer 710 has a flat form, rather than having curved portions.

Figure 13:
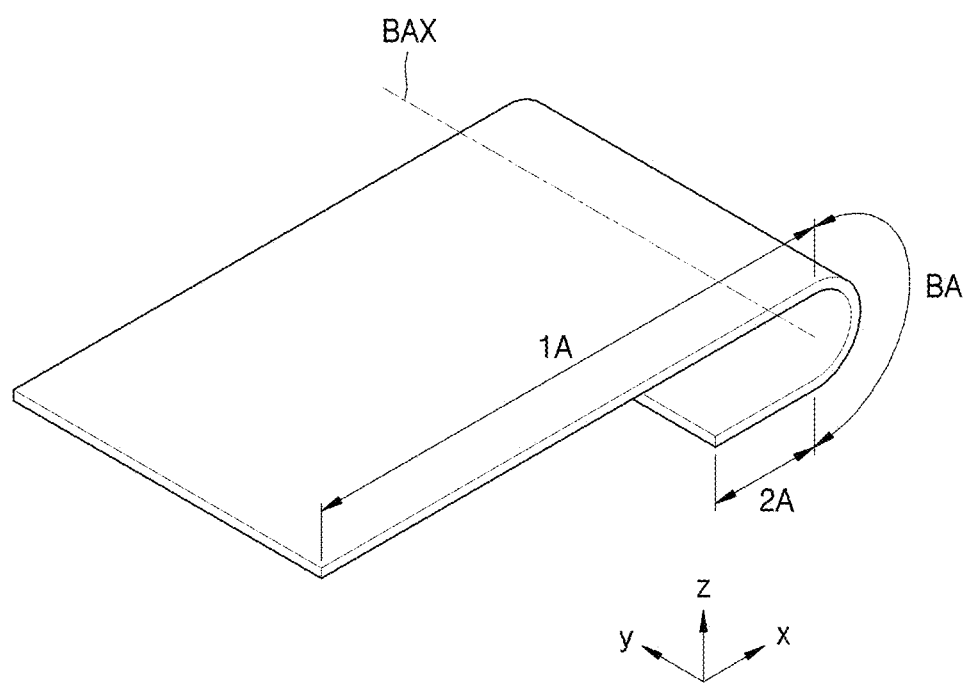
FIG. 13 is a perspective view of a portion of a display panel according to an alternative embodiment.

Herein, as described above, although the display panel has been illustrated and described as having an approximately flat form, the embodiments are not limited thereto. Alternatively, as illustrated in FIG. 13, which is a perspective view of a portion of a display panel according to another alternative embodiment, the display panel may be bent. In one embodiment, for example, the substrate 100 of the display panel includes a bending area BA extending in a first direction (+y direction). The bending area BA is arranged between a first area 1A and a second area 2A in a second direction (+x direction) crossing the first direction. In such an embodiment, the substrate 100 is bent around a bending axis BAX extending in the first direction (+y direction) as illustrated in FIG. 13. In such an embodiment, the substrate 100 may include at least one of various materials having flexible or bendable characteristics, e.g., polymer resins such as polyethersulphone ("PES"), polyacrylate ("PAR"), polyetherimide ("PEI"), polyethylene napthalate ("PEN"), polyethyleneterephthalate ("PET"), polyphenylene sulfide ("PPS"), polyarylate ("PAR"), PI, polycarbonate ("PC"), or cellulose acetate propionate ("CAP"). In such an embodiment, the substrate 100 may have a multi-layered structure including two layers, each including a polymer resin, and a barrier layer including an inorganic material (such as a silicon oxide, a silicon nitride, a silicon oxynitride, etc.) between the two layers, but not being limited thereto. In embodiment, the substrate 100 may be modified variously.

FIG. 14 is a cross-sectional view of the portion of the display panel of FIG. 13. For convenience of illustration, in FIG. 14, the substrate 100, etc., are illustrated as not being bent in the bending area BA. The first area 1A includes a display area DA. As illustrated in FIG. 2, the first area 1A may include, in addition to the display area DA, a portion of the non-display area outside the display area DA. The second area 2A also includes the non-display area. Configurations of the display area DA, the first conductive layer 710 and/or the second conductive layer 720, etc. are the same as those described above with reference to FIG. 2, and modifications described above with reference to FIGS. 3 to 12 are applicable to such an embodiment of the display panel.

In an embodiment, as described above, the encapsulation layer 400 may cover display elements to protect the display elements such as the organic light-emitting device 300 in the display area DA. However, in the case of the pad 700 to which an electrical signal, etc. to be transferred to the display area DA will be applied, the pad 700 is desired not to be covered by the encapsulation layer 400, etc., to allow an electronic device or a PCB, etc. to be electrically connected to the pad 700 afterwards. Therefore, the upper surface 710a of the first conductive layer 710 is entirely exposed to the outside.

The encapsulation layer 400 may include a first inorganic encapsulation layer 410, an organic encapsulation layer 420, and a second inorganic encapsulation layer 430 as illustrated in FIG. 14.

The first inorganic encapsulation layer 410 may cover the opposite electrode 330 and include a silicon oxide, a silicon nitride, and/or a silicon oxynitride. Alternatively, other layers such as a capping layer may be selectively provided between the first inorganic encapsulation layer 410 and the opposite electrode 330. Since the first inorganic encapsulation layer 410 is provided along a structure thereunder, an upper surface of the first inorganic encapsulation layer 410 is not flat as illustrated in FIG. 14. The organic encapsulation layer 420 covers the first inorganic encapsulation layer 410. In such an embodiment, the organic encapsulation layer 420 may have an approximately even upper surface. Specifically, the organic encapsulation layer 420 may have an approximately even upper surface at a portion corresponding to the display area DA. The organic encapsulation layer 420 may include at least one of PET, PEN, PC, PI, polyethylene sulfonate, polyoxymethylene, PAR, and HMDSO. The second inorganic encapsulation layer 430 may cover the organic encapsulation layer 420 and include a silicon oxide, a silicon nitride, and/or a silicon oxynitride. The second inorganic encapsulation layer 430 may cover the organic encapsulation layer 420 to ensure that the organic encapsulation layer 420 is not exposed to the outside by contacting the first inorganic encapsulation layer 410 at an edge thereof arranged outside the display area DA.

In an embodiment, as described above, the encapsulation layer 400 may include the first inorganic encapsulation layer 410, the organic encapsulation layer 420 and the second inorganic encapsulation layer 430. In such an embodiment, even when a crack occurs in the encapsulation layer 400, the crack may be disconnected between the first inorganic encapsulation layer 410 and the organic encapsulation layer 420 or between the organic encapsulation layer 420 and the second inorganic encapsulation layer 430 through the above multi-layered structure. In such an embodiment, forming of a path through which external moisture or oxygen may infiltrate into the display area DA may be effectively prevented or substantially reduced.

A polarization plate 520 may be arranged on the encapsulation layer 400 by using an optically clear adhesive ("OCA") 510. The polarization plate 520 may reduce reflection of external light. In one embodiment, for example, when the external light that has passed through the polarization plate 520 is reflected by an upper surface of the opposite electrode 330 and then passes through the polarization plate 520 again, the external light passes through the polarization plate 520 twice and the phase of the external light may be changed. Therefore, the phase of reflected light may be different from the phase of the external light entering the polarization plate 520 and thus destructive interference occurs. Accordingly, the reflection of the external light may be reduced and visibility may be improved due to the destructive interference. The OCA 510 and the polarization plate 520 may cover an opening (a discontinuous region) in the planarization layer 140 outside the display area DA as shown in FIG. 14. In an alternative embodiment, the polarization plate 520 may be omitted. In such an embodiment, the polarization plate 520 may be omitted and selectively replaced with another element. In one embodiment, for example, the polarization plate 520 may be omitted, and instead, a black matrix and a color filter may be provided to reduce the reflection of external light.

The buffer layer 110, the gate insulating layer 120 and the interlayer insulating layer 130, each of which includes an inorganic material, will be collectively referred as inorganic insulating layers. In an embodiment, an opening corresponding to the bending area BA is defined through the inorganic insulating layers, as illustrated in FIG. 14. In such an embodiment, openings 110a, 120a and 130a are defined through the buffer layer 110, the gate insulating layer 120 and the interlayer insulating layer 130, respectively, to correspond to the bending area BA, e.g., to overlap the bending area BA when viewed from a plan view. In such an embodiment, an area of each opening may be wider than that of the bending area BA. In an embodiment, as shown in FIG. 14 a width OW of an opening is wider than a width BAw of the bending area BA. In such an embodiment, the area of the opening may be defined as an area of an opening having a smallest area among the openings 110a, 120a and 130a of the buffer layer 110, the gate insulating layer 120 and the interlayer insulating layer 130. In an embodiment, as shown in FIG. 14, the area of the opening is defined by the area of the opening 110a of the buffer layer 110.

In an embodiment, after the opening 110a of the buffer layer 110 is formed, the opening 120a of the gate insulating layer 120 and the opening 130a of the interlayer insulating layer 130 may be simultaneously formed. To allow the source electrode 215 and the drain electrode 217 to contact the semiconductor layer 211 when forming the thin film transistor 210, contact holes is desired to be formed through the gate insulating layer 120 and the interlayer insulating layer 130. When forming such contact holes, the opening 120a of the gate insulating layer 120 and the opening 130a of the interlayer insulating layer 130 may be simultaneously formed. Accordingly, an inner surface of the opening 120a of the gate insulating layer 120 and an inner surface of the opening 130a of the interlayer insulating layer 130 may form a continuous plane as illustrated in FIG. 14.

In an embodiment, the display panel includes an organic material layer 160 filling at least a portion of the inorganic insulating layers. In an embodiment, as shown in FIG. 14, the organic material layer 160 may completely fill the opening. In an embodiment, the display panel includes a connection wire layer 215c. The connection wire layer 215c may extend from the first area 1A to the second area 2A via the bending area BA and is arranged on the organic material layer 160. In an embodiment, where the organic material layer 160 is absent, the connection wire layer 215c may be arranged on the inorganic insulating layer such as the interlayer insulating layer 130. The connection wire layer 215c may include a same material as that of the source electrode 215 or the drain electrode 217, and may be formed simultaneously with the source electrode 215 or the drain electrode 217. In an embodiment, the first conductive layer 710 may include a same material as that of the connection wire layer 215c, and may be formed simultaneously with the connection wire layer 215c.

In an embodiment, as described above and as shown in FIG. 14, the display panel is not bent, but not being limited thereto. In an alternative embodiment of the display panel, the substrate 100, etc. are bent in the bending area BA as illustrated in FIG. 13. In such an embodiment, the display panel is manufactured such that the substrate 100 is approximately flat as illustrated in FIG. 14 during the manufacturing process, and thereafter, the display panel may be shaped as illustrated in FIG. 13 through bending of the substrate 100, etc. in the bending area BA. In such an embodiment of the display panel, though tensile stress may be applied to the connection wire layer 215c while the substrate 100, etc. are bent in the bending area BA, occurrence of a defect in the connection wire layer 215c during the bending process may be effectively prevented or substantially reduced.

If the inorganic insulating layers such as the buffer layer 110, the gate insulating layer 120 and/or the interlayer insulating layer 130 do not have openings and thus have continuous shapes over the first area 1A to the second area 2A, and the connection wire layer 215c is arranged on the inorganic insulating layers, a large amount of tensile stress may be applied to the connection wire layer 215c while the substrate 100, etc. are bent during a manufacturing process. Particularly, since hardness of the inorganic insulating layers is typically higher than that of the organic material layer, a crack, etc. is likely to occur in the inorganic insulating layers in the bending area BA. When a crack occurs in the inorganic insulating layers, a crack, etc. occur in the connection wire layer 215c on the inorganic insulating layers and thus a probability of occurrence of a defect such as disconnection, etc. of the connection wire layer 215c is very high.

In an embodiment of the display panel according to the invention, an opening is defined through the inorganic insulating layer in the bending area BA, and a portion of the connection wire layer 215c corresponding to the bending area BA is arranged on the organic material layer 160 filling at least a portion of the opening of the inorganic insulating layer as described above. Since an opening is defined through the inorganic insulating layer in the bending area BA, a probability of occurrence of a crack, etc. in the inorganic insulating layer is substantially low, and the organic material layer 160 has a characteristic of including an organic material and thus a probability of occurrence of a crack is low. Therefore, occurrence of a crack, etc. in a portion of the connection wire layer 215c corresponding to the bending area BA arranged on the organic material layer 160 may be prevented or a probability of occurrence of a crack may be reduced. The organic material layer 160 has a hardness less than that of an inorganic material layer and thus may absorb tensile stress generated due to bending of the substrate 100, etc. and effectively reduce concentration of tensile stress on the connection wire layer 215c.

Although FIG. 14 illustrates an embodiment, where an opening is defined through the inorganic insulating layers, the embodiment is not limited thereto. In one alternative embodiment, for example, the inorganic insulating layers may have a groove instead of an opening. In one alternative embodiment, for example, no opening is defined through the buffer layer 110, the buffer layer 110 extends from the first area 1A to the second area 2A via the bending area BA, and the openings 120a and 130a are defined only through the gate insulating layer 120 and the interlayer insulating layer 130, respectively. In such an embodiment, as described above, the buffer layer 110, the gate insulating layer 120 and the interlayer insulating layer 130, each including an inorganic material, may be collectively referred to as inorganic insulating layers. In such an embodiment, the inorganic insulating layers may be understood as having a groove corresponding to the bending area BA. In such an embodiment, the organic material layer 160 may fill a portion of the groove.

In an embodiment, the display panel may include additional connection wire layers 213a and 213b in addition to the connection wire layer 215c. The additional connection wire layers 213a and 213b may be arranged in the first area 1A or the second area 2A such that the additional connection wire layers 213a and 213b are arranged in a layer different from the layer in which the connection wire layer 215c is arranged, and may be electrically connected to the connection wire layer 215c. FIG. 14 illustrates that the additional connection wire layers 213a and 213b include a same material as that of the gate electrode 213 of the thin film transistor 210 and are arranged in the layer in which the gate electrode 213 is arranged. In such an embodiment, the additional connection wire layers 213a and 213b are arranged on the gate insulating layer 120. In an embodiment, as shown in FIG. 14, the connection wire layer 215c may contact the additional connection wire layers 213a and 213b via contact holes of the interlayer insulating layer 130. In such an embodiment, as shown in FIG. 14, the additional connection wire layer 213a and the additional connection wire layer 213b may be arranged in the first area 1A and the second area 2A, respectively. In an embodiment, the second conductive layer 720 may include a same material as that of the additional connection wire layers 213a and 213b, and may be formed simultaneously with the additional connection wire layers 213a and 213b. In such an embodiment, the second conductive layer 720 and the additional connection wire layers 213a and 213b may be integrally formed as a single unitary body.

The additional connection wire layer 213a arranged in the first area 1A may be electrically connected to the thin film transistor, etc. within the display area DA, and thus, the connection wire layer 215c may be electrically connected to the thin film transistor, etc., within the display area DA via the additional connection wire layer 213a. The additional connection wire layer 213b may be electrically connected to the thin film transistor, etc., within the display area DA via the connection wire layer 215c. In an embodiment, as described above, the additional connection wire layers 213a and 213b may be electrically connected to elements arranged inside the display area DA while the additional connection wire layers 213a and 213b are arranged outside the display area DA. While the additional connection wire layers 213a and 213b are arranged outside the display area DA, the additional connection wire layers 213a and 213b may extend in a direction of the display area DA and at least a portion of the additional connection wire layers 213a and 213b may be arranged inside the display area DA.

In an embodiment, a bending protection layer ("BPL") 600 may be arranged outside the display area DA. In such an embodiment, the BPL 600 may be arranged over the connection wire layer 215c in a region corresponding to at least the bending area BA.

When a certain stacked body is bent, a stress-neutral plane exists within the stacked body. If the BPL 600 is absent, excessive tensile stress, etc., may be applied to the connection wire layer 215c within the bending area BA while the substrate 100, etc. are bent. This is because a location of the connection wire layer 215c may not correspond to a stress-neutral plane. However, a location of a stress-neutral plane may be adjusted in a stacked body including all of the substrate 100, the connection wire layer 215c, the BPL 600, etc., by providing the BPL 600 and by adjusting a thickness and a modulus of the BPL 600. Therefore, tensile stress applied to the connection wire layer 215c may be minimized or compression stress may be applied to the connection wire layer 215c by allowing a stress-neutral plane to be arranged in the vicinity of or over the connection wire layer 215c via the BPL 600. The BPL 600 may include an acryl. For reference, in the case where compression stress is applied to the connection wire layer 215c, a probability that the connection wire layer 215c is damaged by the compression stress is extremely low compared to a case where tensile stress is applied to the connection wire layer 215c.

In such an embodiment, since an electronic device or a PCB, etc. is desired to be electrically connected to the pad 700 to transfer an electrical signal, etc. to the display area DA afterwards, the BPL 600 does not cover the first conductive layer 710. Therefore, an upper surface 710a of the first conductive layer 710 is entirely exposed to the outside.

Although some embodiments of the display panel have been described above, the embodiments of the invention are not limited thereto. That is, a display device including the display panel as an element thereof is included in the scope of the disclosure.

Figure 15:
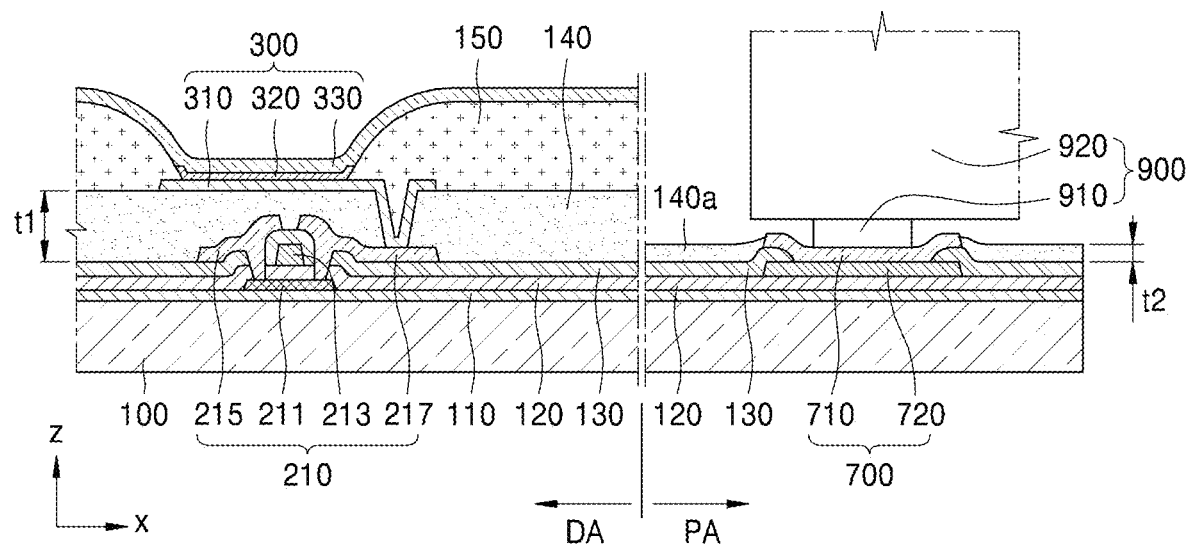
FIG. 15 is a cross-sectional view of a display device according to another alternative embodiment.

FIG. 15 is a cross-sectional view of a display device according to another alternative embodiment.

In an embodiment, as illustrated in FIG. 15, the display device includes the display panel corresponding to one of the above-described embodiments or modifications, and a conductive material layer directly contacting an upper surface (+z direction) of the first conductive layer 710 of the display panel. In such an embodiment, the display device includes the substrate 100 including the display area DA and the peripheral area PA outside the display area DA, the first conductive layer 710, and a conductive material layer. The first conductive layer 710 is arranged in the peripheral area PA and an edge of an upper surface of the first conductive layer 710 is not covered by an insulating layer such as the pad division layer 140a. In such an embodiment, as described above, the first conductive layer 710 includes the main part 711 (see FIGS. 3 to 11) and the plurality of protrusions 712 (see FIGS. 3 to 11) protruding from the main part 711 in a direction parallel to an upper surface of the substrate 100. In such an embodiment, the conductive material layer directly contacts an upper surface of the first conductive layer 710.

Figure 16:
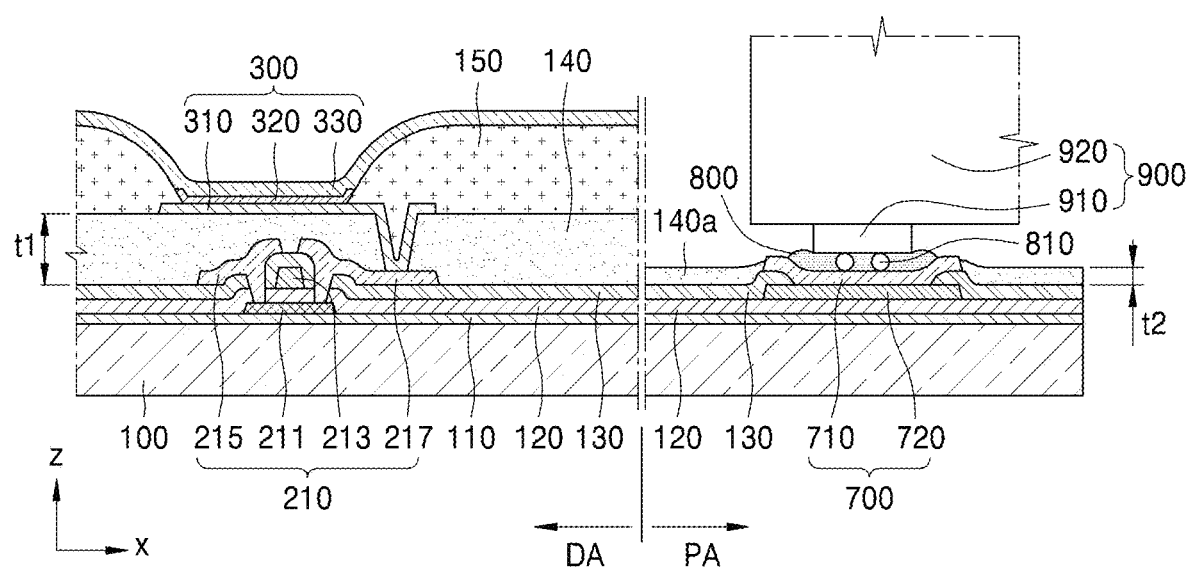
FIG. 16 is a cross-sectional view of a display device according to another alternative embodiment.

FIG. 15 illustrates a bump 910 under a body 920 of an electronic device 900 such as an integrated circuit device as a conductive material layer directly contacting an upper surface of the first conductive layer 710. However, embodiments are not limited thereto. Alternatively, as illustrated in FIG. 16, which is a cross-sectional view of a display device according to another alternative embodiment, the conductive material layer may be a conductive adhesive layer. In such an embodiment, the conductive material layer may be an anisotropic conductive film ("ACF") 800 including a conductive ball 810. In such an embodiment, the bump 910 under the body 920 of the electronic device 900 contacts the conductive ball 810 of the ACF 800, and the conductive ball 810 contacts an upper surface of the first conductive layer 710. Therefore, the bump 910 of the electronic device 900 is electrically connected to the first conductive layer 710. The conductive material layer may be a conductive adhesive layer as well as the ACF 800.

Figure 17:
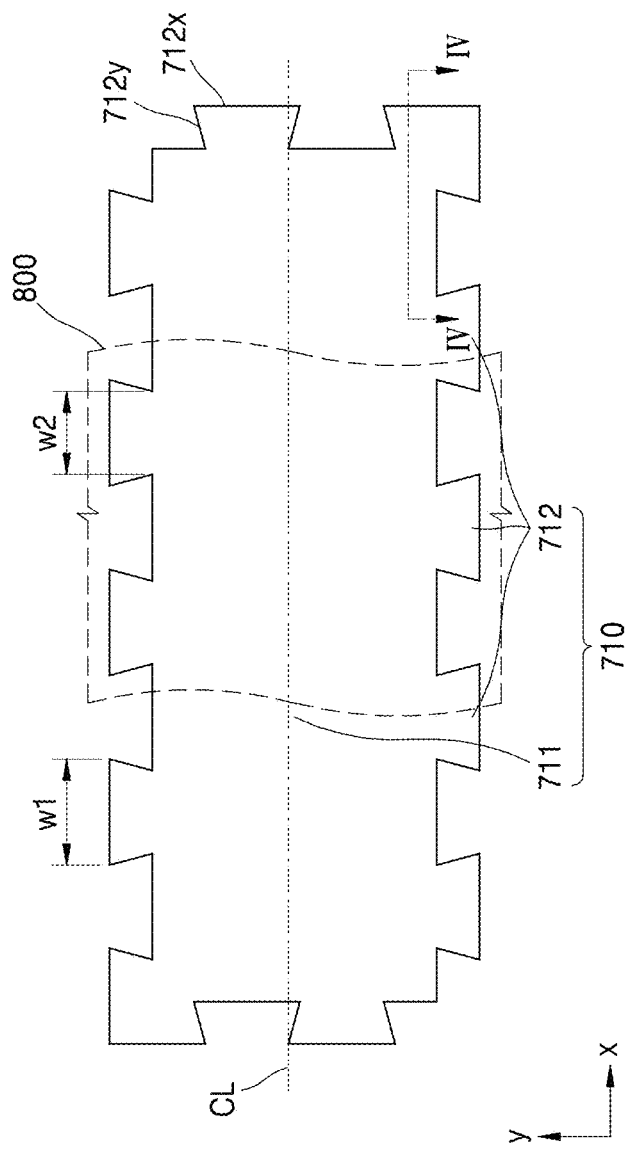
FIG. 17 is a plan view of a first conductive layer of a display device according to another alternative embodiment.

In an embodiment, as illustrated in FIG. 17, which is a plan view of a first conductive layer of a display device according to another alternative embodiment, the first conductive layer 710 may have a shape extending in a predetermined direction (e.g., a direction parallel to x-axis). A central axis CL of the first conductive layer 710 may be parallel to the predetermined direction (x-axis direction) in which the first conductive layer 710 extends. A conductive adhesive layer such as the ACF 800 may cover an entire upper surface of the first conductive layer 710 in a direction (y-axis direction) crossing the central axis CL of the first conductive layer 710. In such an embodiment, the conductive adhesive layer or the ACF 800 may completely cover an upper surface of some of the protrusions 712 of the first conductive layer 710. In such an embodiment, as illustrated in FIG. 17, a portion of an upper surface of the first conductive layer 710 may not be covered by the conductive adhesive layer. That is, it may be understood that an entire upper surface of at least one of the protrusions 712 of the first conductive layer 710 is covered by the conductive adhesive layer.

In such embodiments, the display device may prevent occurrence of a short circuit between the adjacent first conductive layers 710 during a manufacturing process. Although FIGS. 15 and 16 show embodiments where the display device includes the electronic device 900, embodiments are not limited thereto. The display device may include a PCB including pads electrically connected to the first conductive layer 710 and may be modified variously.

For reference, an edge of an upper surface of the first conductive layer 710 of the pad 700 is not covered by the pad division layer 140a, etc. as described above, and the upper surface of the first conductive layer 710 is exposed. This is for the purpose of securing a minimum area via which the pad 700 is exposed under conditions in which an area of the peripheral area PA is reduce, and not the display area DA in the display panel. If an area exposing the pad 700 of the display panel is reduced, an area in which the bump, etc. of the electronic device 900 contact the pad 700 of the display panel is reduced, and thus alignment of the bump, etc. of the electronic device 900 and the pad 700 of the display panel may not be effectively performed. Also, to implement a high-resolution display panel, the number of the pads 700 of the display panel may increase. Therefore, to sufficiently secure an area via which each of the pads 700 is exposed while arranging a greater number of pads 700 in a limited area of the peripheral area PA, an entire upper surface of the first conductive layer 710 of the pad 700 is desired to be exposed as described above.

For this purpose, in various embodiments and modifications thereof, as shown in FIGS. 15 and 16, an edge of an upper surface of the first conductive layer 710 of the pad 700 may not be covered by the pad division layer 140a by making a thickness t2 of the pad division layer 140a including a same material as that of the planarization layer 140 less than a thickness t1 of the planarization layer 140. The pad division layer 140a may not be provided at a portion where the pad 700 is arranged, and in the vicinity of the pad 700, a layer, for example, the interlayer insulating layer 130 arranged under the first conductive layer 710 of the pad 700 may be exposed as an uppermost layer to the outside when needed.

Embodiment of the display device shown in FIGS. 15 to 17 may include an embodiment of a display panel described above with reference to FIGS. 1 to 14. That is, as far as the display device includes one of the display panels described with reference to FIGS. 1 to 14, an embodiment of a display panel and modifications thereof, and the conductive material layer directly contacting an upper surface of the first conductive layer 710, the display device belongs to the display device according to the embodiments.

Although the invention has been described with reference to the embodiments illustrated in the drawings, such embodiments are merely exemplary, and it will be understood by those of ordinary skill in the art that various changes in form and details and equivalents thereof may be made therein without departing from the spirit and scope of the invention as defined by the following claims.

What is claimed is:
1. A display panel comprising:
a substrate comprising a display area and a peripheral area outside the display area; and
a first conductive layer in the peripheral area, wherein an entire upper surface of the first conductive layer is exposed to an outside,
wherein the first conductive layer comprises a main part and a plurality of protrusions protruding from all sides defining the main part in a direction parallel to an upper surface of the substrate when viewed from a plan view in a thickness direction of the first conductive layer.
2. The display panel of claim 1, wherein
at least a portion of the main part has a three-layered structure, and
at least a portion of a protrusion of the plurality of protrusions has a two-layered structure.
3. The display panel of claim 2, wherein
the three-layered structure of the at least a portion of the main part is defined by a lower main layer, an intermediate main layer on the lower main layer, and an upper main layer on the intermediate main layer, and
the two-layered structure of the at least a portion of the protrusion is defined by a lower protrusion layer and an intermediate protrusion layer on the lower protrusion layer.
4. The display panel of claim 3, wherein
the lower main layer and the lower protrusion layer are integrally formed as a single unitary body, and
the intermediate main layer and the intermediate protrusion layer are integrally formed as a single unitary body.
5. The display panel of claim 3, wherein
an outer side of the intermediate protrusion layer is closer to a center of the main part than an outer side of the lower protrusion layer is.
6. The display panel of claim 1, wherein
at least a portion of the main part has a two-layered structure, and
at least a portion of a protrusion of the plurality of protrusions has a single-layered structure.
7. The display panel of claim 6, wherein
the two-layered structure of the at least a portion of the main part is defined by a lower main layer and an upper main layer on the lower main layer, and
the single-layered structure of the at least a portion of the protrusion is defined by a lower protrusion layer.
8. The display panel of claim 7, wherein the lower main layer and the lower protrusion layer are integrally formed as a single unitary body.
9. The display panel of claim 1, wherein a width of a distal portion of the plurality of protrusions in a direction away from the main part is greater than a width of a proximal portion of the plurality of protrusions in a direction toward the main part.
10. The display panel of claim 1, wherein a width of a distal portion of the plurality of protrusions in a direction away from the main part is less than a width of a proximal portion of the plurality of protrusions in a direction toward the main part.
11. The display panel of claim 1, wherein
at least a portion of the main part has a multi-layered structure, and
at least a portion of a protrusion of the plurality of protrusions has a multi-layered structure the same as the multi-layered structure of the at least a portion of the main part.
12. The display panel of claim 1, further comprising:
a second conductive layer under the first conductive layer, wherein the second conductive layer has a shape corresponding to that of the main part.

13. The display panel of claim 12, wherein an orthogonal projection of an edge of the main part onto the substrate overlaps an orthogonal projection of an edge of the second conductive layer onto the substrate.

14. The display panel of claim 12, further comprising:
- an insulating layer between the first conductive layer and the second conductive layer,
- wherein an opening is defined through the insulating layer, and
- wherein a central portion of the second conductive layer directly contacts a central portion of the main part via the opening.

15. The display panel of claim 12, wherein an orthogonal projection of the plurality of protrusions onto the substrate is located outside an orthogonal projection of an edge of the second conductive layer onto the substrate.

16. The display panel of claim 1, wherein a width of at least one of the plurality of protrusions is less than a distance between the first conductive layer and a conductive layer adjacent to the first conductive layer.

* * * * *